United States Patent [19]

Smith et al.

[11] Patent Number: 4,928,378

[45] Date of Patent: May 29, 1990

[54] APPARATUS FOR MAKING PLASTIC LEADED CHIP CARRIER CONNECTORS

[75] Inventors: Donald A. Smith; William H. Carter, both of Union City; Howard E. Dingfelder, Corry; Dale L. Burgess, Union City; Alan B. Gates, Corry, all of Pa.

[73] Assignee: Barnes Group Inc., Bristol, Conn.

[21] Appl. No.: 383,464

[22] Filed: Sep. 5, 1989

Related U.S. Application Data

[62] Division of Ser. No. 230,810, Aug. 10, 1988, Pat. No. 4,879,808.

[51] Int. Cl.$^5$ .................................... H01R 43/00
[52] U.S. Cl. .................. 29/564.6; 29/33 M; 29/564.1; 29/564.8; 29/739; 29/747
[58] Field of Search ............ 29/739, 741, 747, 33 M, 29/564.1, 564.6, 564.8, 845, 882, 884

[56] References Cited

U.S. PATENT DOCUMENTS

| | | | |
|---|---|---|---|
| 3,257,708 | 6/1966 | Stricker | 29/845 |
| 3,829,949 | 8/1974 | Spencer | 29/845 X |
| 4,108,217 | 8/1978 | Westberg, II | 140/105 |
| 4,176,448 | 12/1979 | Zahn et al. | 29/739 X |
| 4,429,456 | 2/1984 | Zahn | 29/739 X |
| 4,550,493 | 11/1985 | Darrow et al. | 29/845 X |
| 4,631,821 | 12/1986 | Houser | 29/845 |
| 4,688,150 | 8/1987 | Peterson | 361/403 |
| 4,729,739 | 3/1988 | Coffee et al. | |
| 4,741,100 | 5/1988 | Pierson | 29/845 |
| 4,744,140 | 5/1988 | Bright | 29/741 |

Primary Examiner—Carl E. Hall
Attorney, Agent, or Firm—Pennie & Edmonds

[57] ABSTRACT

A plastic leaded chip carrier connector of a base having a plurality of apertures for receiving and orienting a plurality of wire pins therein, and a plurality of wire pins each of a predetermined configuration lockingly engaged within a corresponding aperture of the base for transmitting electrical information therethrough. A method for making such connectors by aligning the base with a wire feed device, advancing one end of a wire from the wire feed device on one side of the base through an aperture in the base to the opposite side of the base, forming a predetermined configuration of the wire end, retracting the formed wire into the aperture to lockingly engage said formed wire end therein, cutting the wire to form a pin locked in the aperture, and repeating the previous steps to form a pin in each aperture of the base. Also, an apparatus for carrying out this method to manufacture the desired connectors.

24 Claims, 10 Drawing Sheets

FIG. 1
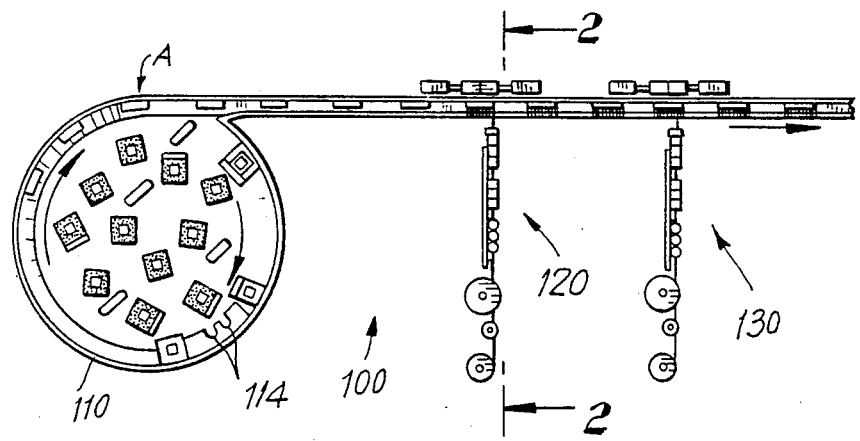
FIG. 13
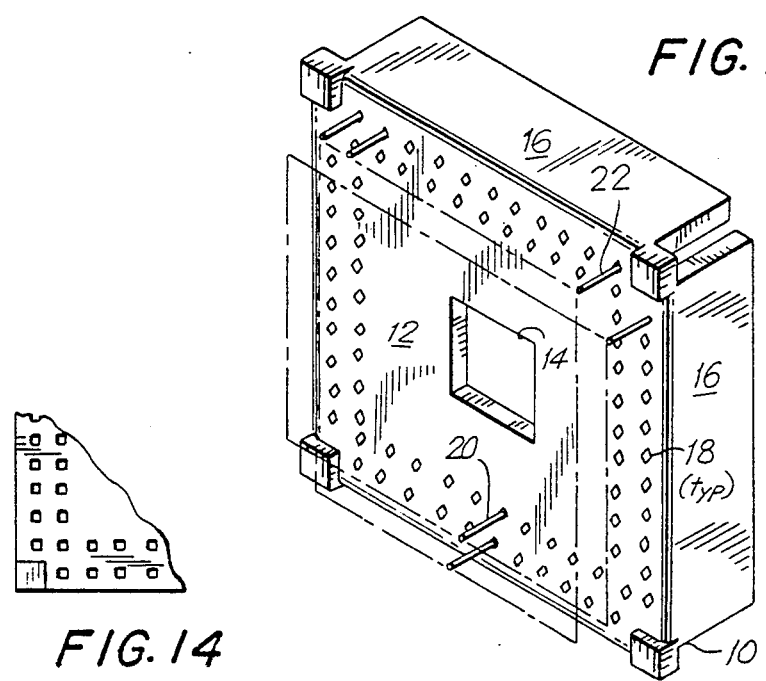
FIG. 14

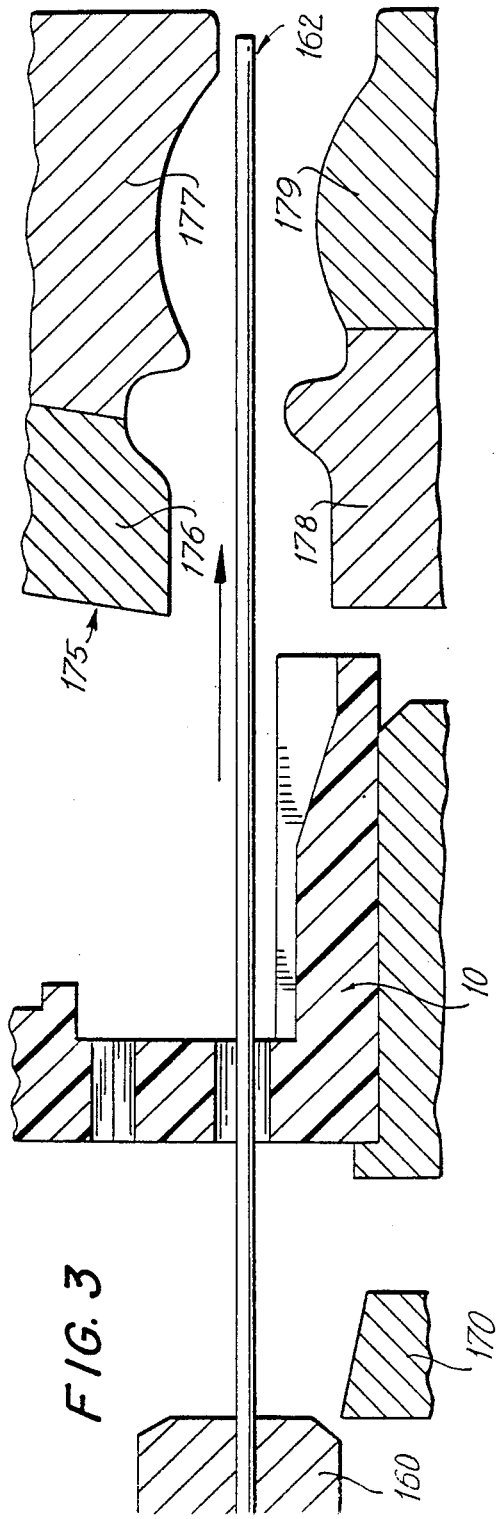
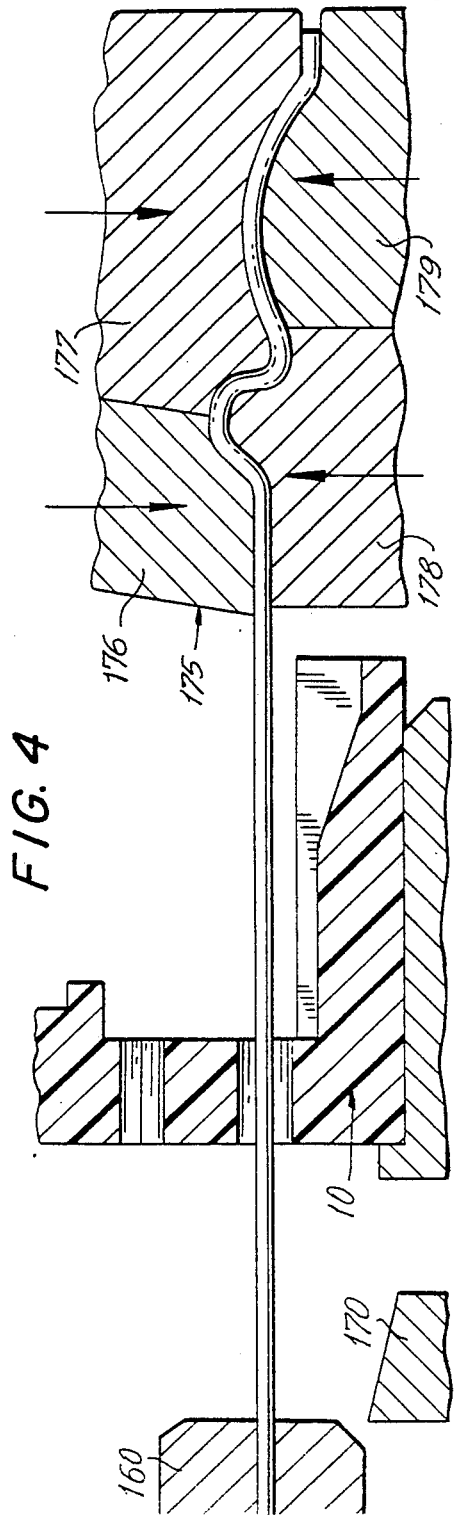

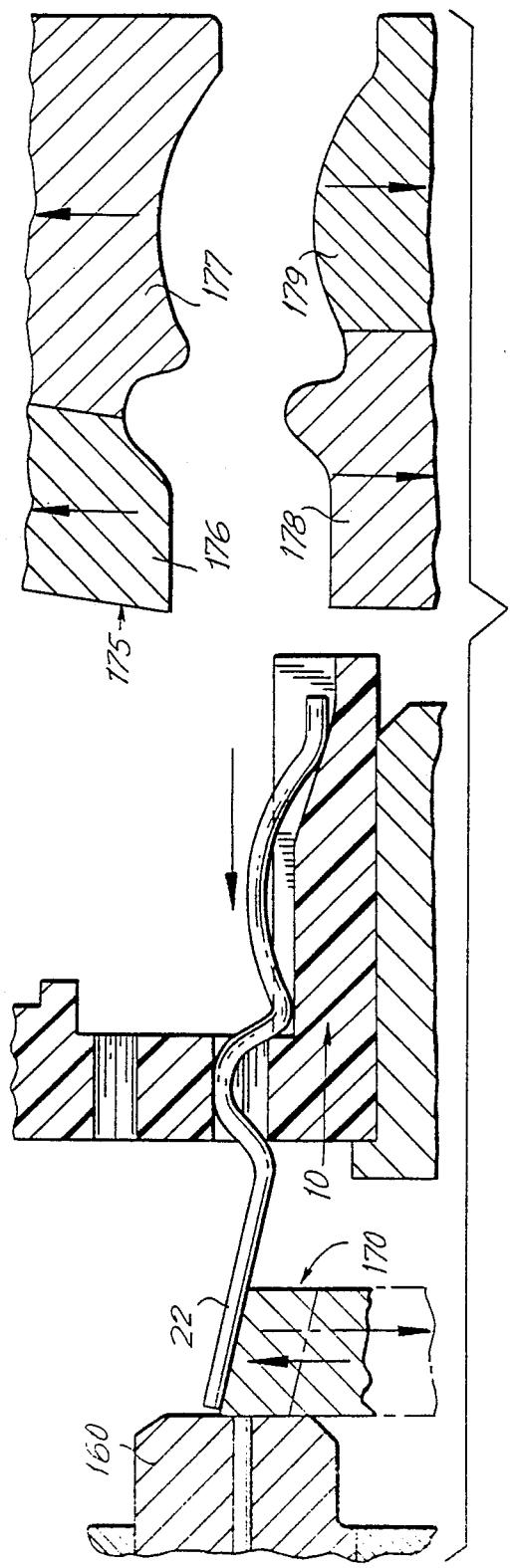
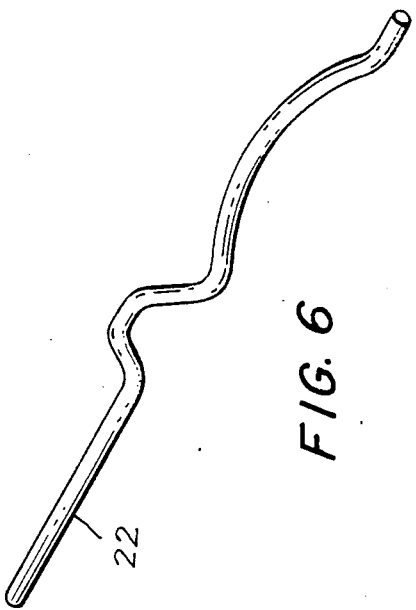
FIG. 5
FIG. 6

FIG. 11
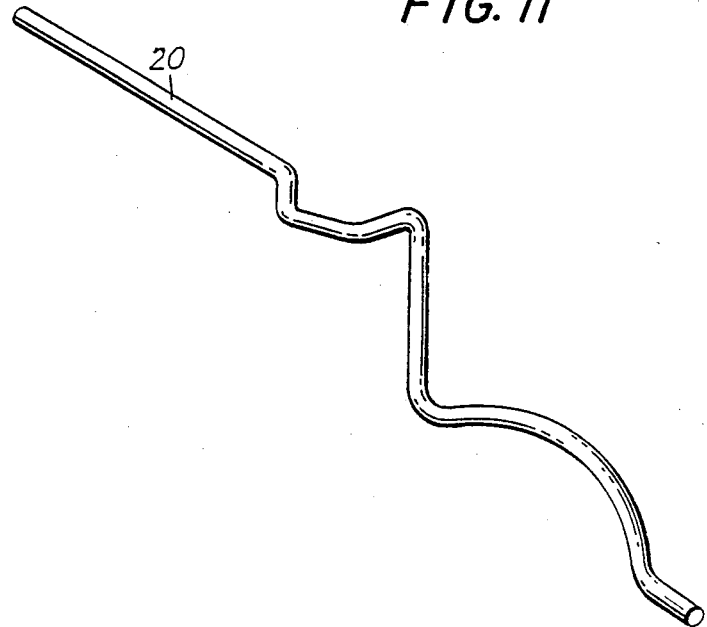
FIG. 12
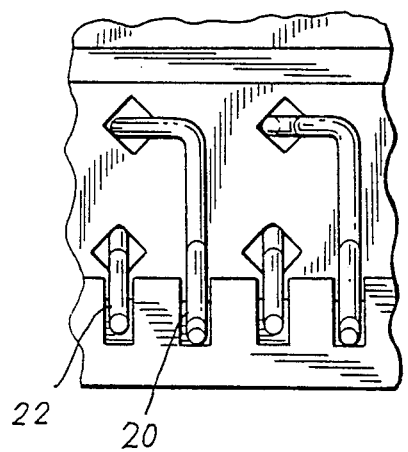
FIG. 15
PRIOR ART
FIG. 16
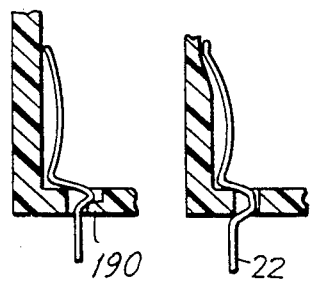

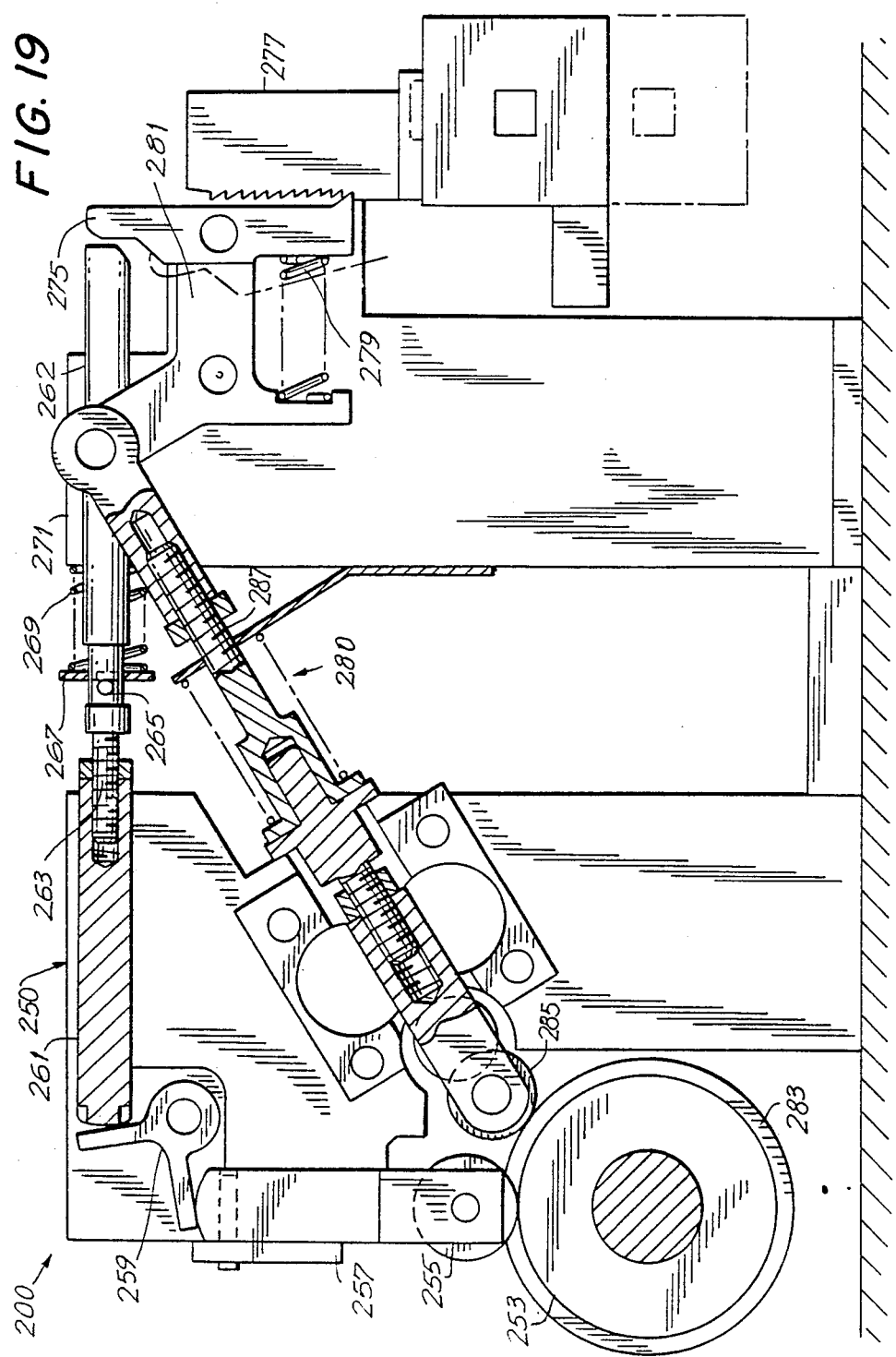

APPARATUS FOR MAKING PLASTIC LEADED CHIP CARRIER CONNECTORS

This is a division of application Ser. No. 230,810 filed Aug. 10, 1988, now U.S. Pat. No. 4,879,808.

TECHNICAL FIELD

This invention relates to a plastic leaded chip carrier connector having a plurality of rounded wire pins in a plastic housing or cube for holding and mounting integrated circuit chips onto printed circuit boards or the like. The invention also includes novel methods and apparatus for manufacturing such connectors in an efficient and precise manner.

BACKGROUND ART

Plastic leaded chip carrier ("PLCC") connectors which are known in the art include a plastic base having round, flat or rectangular pin contacts. A typical PLCC connector is described in U.S. Pat. No. 4,729,739. This patent discloses a connector for mounting and electrically connecting a chip carrier unit in an electrical circuit has a plurality of electrical contacts secured in openings in the bottom of an electrically insulating body to permit cantilever spring deflection of the contacts in accommodating a chip carrier unit within the connector between the contacts. The contacts comprise wire members of round cross section each having an opposite end bent to be slidable along a narrow line of engagement with an inclined ramp surface on an adjacent side wall of the connector body. Each contact has a bowed portion intermediate the contact ends which is bowed away from the adjacent ramp surface to slidbly engage terminals on the chip carrier unit as the unit is inserted into the connector. Engagement with the chip carrier terminals permits selected flattening of the bowed portions of the contacts and sliding of the opposite contact ends on the adjacent side wall ramp surfaces to provide simple beam spring deflection of the contacts in combination with the cantilever spring deflection, thereby to provide a force for resiliently engaging the chip carrier terminals.

According to conventional manufacturing techniques, a plurality of these pins are first made and then assembled into the plastic base in a predetermined pattern, usually in rows along each side on a peripheral portion thereof.

The plastic base and pins are separately manufactured and shipped to an assembly location, where an operator would manually insert each pin into each of the respective apertures in the base to form the PLCC connector. This manufacturing technique is unsatisfactory, since high production quantities could not be achieved at a reasonable cost.

A subsequent development includes the mounting of the formed pins onto a long brass strip, termed a "bandolier." This presents a continuously extending ordered array of pins which could be cut at predetermined intervals so that one entire side of the base, consisting of the desired number of pins (i.e., 6, 8, 9, 10, etc.), could be inserted in a single operation. This strip mounting process enables increased production to be achieved at lower cost. This bandolier operation represents a separate, additional manufacturing step which is undesirable, and does not enable precise tolerances to be met, thus requiring straightening and alignment of the pins after insertion.

SUMMARY OF THE INVENTION

The present invention relates to a method and apparatus for manufacturing PLCC connectors and to the novel connectors made thereby. Each aspect of the invention represents a significant improvement over previous products and manufacturing techniques. These improvements include:

(1) a new pin configuration and base aperture design modification which enables the pins to snap or lock in place in the respective base apertures in an accurate, precise and reproducible manner heretofore not achieved by previous assemblies;

(2) a new machine for continuously forming and inserting the pins into the apertures of the plastic base; and (3) a novel manufacturing process utilizing the new machine with additional components for making such plastic leaded chip carrier connectors in a more efficient manner which enables extremely high, increased production rates to be achieved.

The product has three inventive embodiments: the pins themselves are made in a manner so that they can lock or snap into an aperture in the base; the base itself has a square aperture for each pin, whereby each aperture is oriented 90° disposed from those of the prior art; and the overall connector assembly has a novel orientation of square apertures with pins locked therein. Thus, the pins are locked in the aperture and are each maintained in a precise location, so that straightening or reorientation of the pins after assembly is unnecessary.

The second embodiment of the invention, the new machine, enables the simultaneous forming and insertion of the wire pins into the base. At one end of the machine, a spool of wire provides an essentially continuous supply of wire, e.g., enough for one day's operation. The leading end of the wire passes through a block which straightens the wire, and then is grasped by jaws for advancing the wire forward. The forward end of the wire is advanced into and through an aperture in the base, and thereafter into a forming tool which forms the wire into the desired shape and configuration for the pin. Since the advancing jaws still hold the rearward end of the formed wire, it then retracts the wire to snap the pin into the correct position in the respective base aperture. Thereafter, the rearward end of the pin is cut, the base is indexed to the next aperture, and the wire is advanced, formed, retracted, positioned and cut as previously described. When a square or rectangular base is used, the indexing mechanism allows the wire pins to be inserted along one edge of the base, while thereafter, a pivot arm can be used to rotate the cube 90° so that pins may be inserted along a second side. After two further rotations by the pivot arm, the entire periphery of the square or rectangular base is provided with wire pins. A round base can also be utilized, with the indexing mechanism rotating the base through the appropriate anagle to position the adjacent aperture with respect to the wire.

A particular PLCC connector of interest includes two rows of pins: an outer row and an inner row. Two wire inserting modules are required on the machine: one to insert the outer pins and one to insert the inner pins. Each module works in the same manner described above, but two are needed because of the difference in position and pin form of the inner and outer rows on the base.

Finally, the novel sequence of processing steps form a third embodiment of the invention. As noted above, the prior art does not simultaneously form and insert a pin into an aperture of the base while automatically and sequentially repeating this step for adjacent apertures.

BRIEF DESCRIPTION OF THE DRAWINGS

Preferred embodiments of the invention are described hereinbelow with reference to the drawing figures wherein:

FIG. 1 is a top plan view of a vibrating bowl feeder for the plastic bases and inner and outer wire feed devices according to the invention;

FIG. 3 is a side view partially in cross section of the inner wire feed device of FIG. 1 illustrating the wire end passing through a base and into the outer pin forming mold;

FIG. 4 is a side view similar to FIG. 3 with the outer pin forming mold engaging the wire end;

FIG. 5 is a side view of the formed outer pin retracted into position in the base;

FIG. 6 is a perspective view of the formed outer pin;

FIG. 11 is a perspective view of the formed inner pin;

FIG. 12 is an enlarged top view of the base illustrating the position of the inner and outer pins therein;

FIG. 13 is a perspective view of the final plastic leaded chip carrier connector according to the invention;

FIG. 14 is a partial top corner view of a plastic base according to the prior art;

Figure 17:
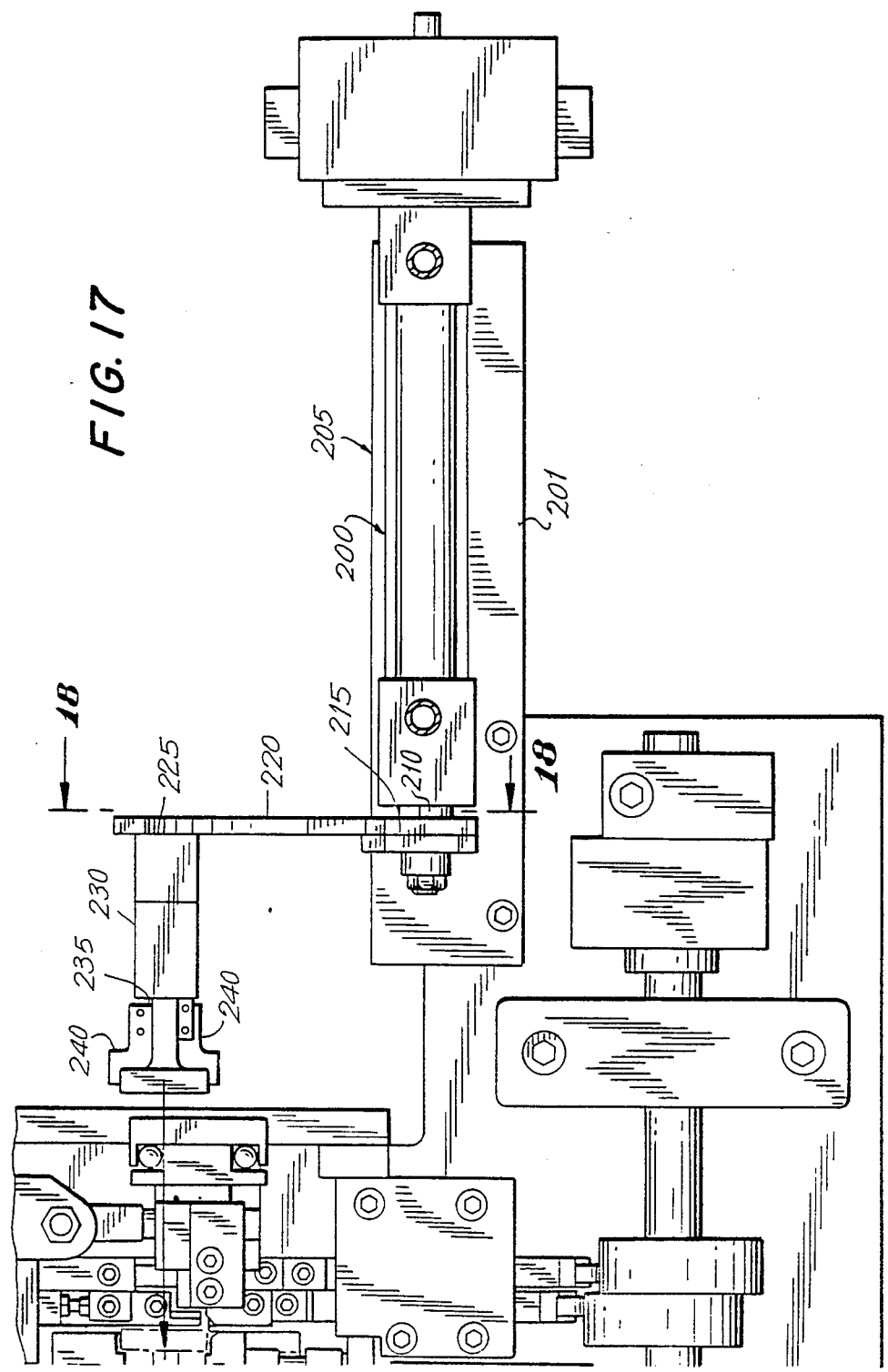
Figure 18:
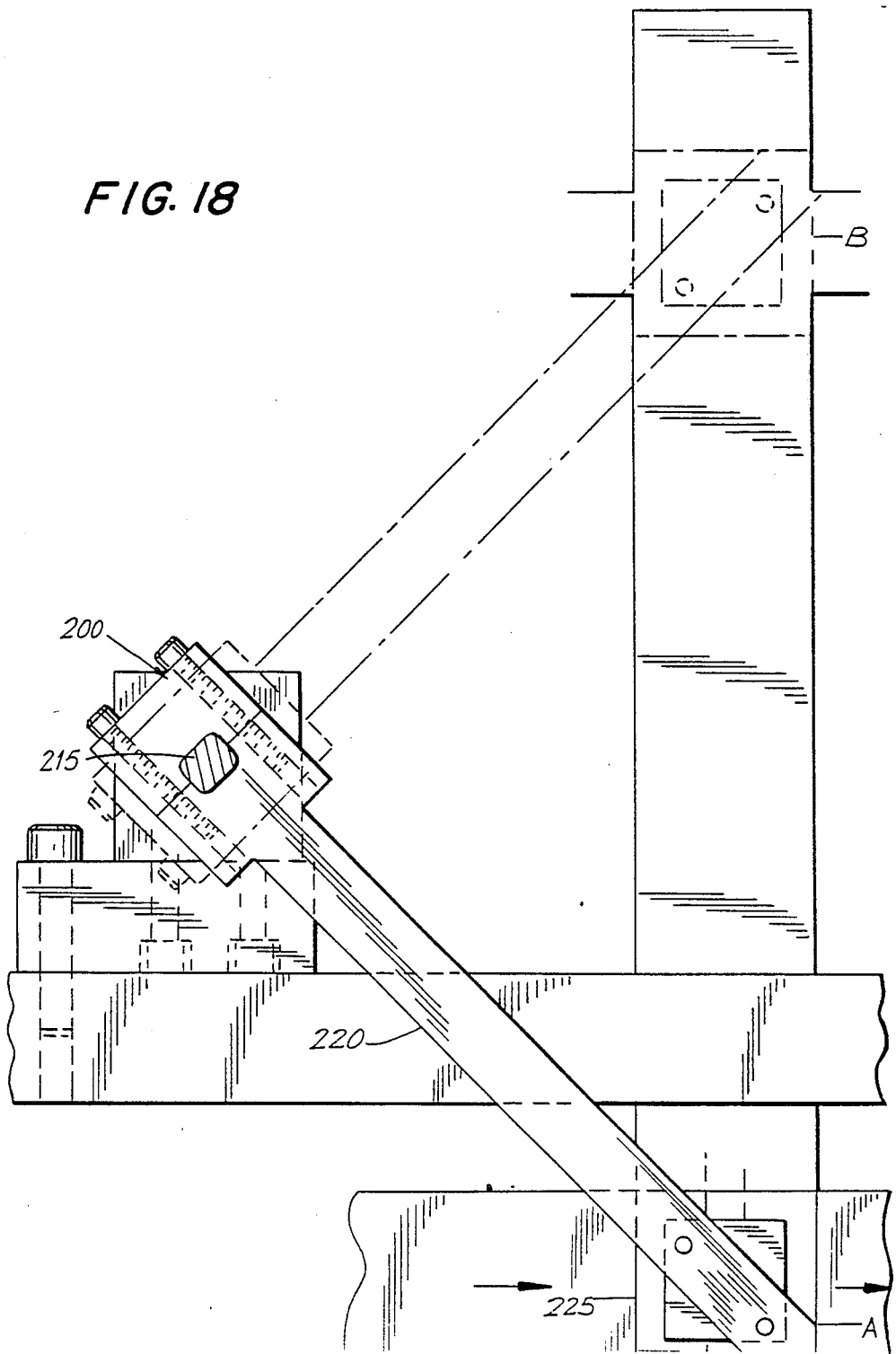

15 is a side view partially in cross section of an outer pin in position in the base of FIG. 14;

FIG. 16 is a side view partially in cross section of an outer pin in position in the base of FIG. 13;

FIG. 17 is a top view of a plastic base rotator arm of the invention;

FIG. 18 is a side view of the rotator arm of FIG. 17; and

FIG. 19 is a side view of an indexing mechanism for placement of the plastic bases into alignment with the wire feed device and pin forming mold.

DETAILED DESCRIPTION OF THE PREFERRED EMBODIMENTS

The invention will now be described with respect to the manufacture of the most preferred embodiment, a PLCC connector having square plastic base having two spaced rows of pins around its periphery. U.S. Pat. No. 4,729,739 discloses an earlier version of such PLCC connector and, to the extent that similar features are disclosed, the content of this patent is expressly incorporated herein by reference thereto.

This plastic base is generally referred to as a cube. As best illustrated in FIG. 13, the cube 10 has an alignment aperture 14 in a generally flat bottom portion 12, with four walls 16 extending perpendicular to the bottom portion so as to form the four sides of the cube. These cubes are usually of molded plastic construction. An inner and outer row of spaced square apertures 18 are provided for reception of the inner pins 20 and outer pins 22, respectively. These square apertures are orineted with their corners pointing toward the side walls 16 of the cube 10 assist in aligning the pins in the proper position in the cube. The pins which extend from the bottom portion 12 plug into an electrical device and transmit electrical signals from the device, through the cube and into an integrated circuit chip which is carried therein (not shown).

FIG. 1 illustrates the overall arrangement of manufacturing system 100 according to the invention. A supply of cubes is placed into a vibrating bowl 110 which has a helically extending track 112 for delivery and orientation of the cubes 10 for subsequent operations. As the bowl and track vibrate, the cubes first move to the outer periphery of the bowl and then upwardly along the track. The width of the track is less than the width of the cube and is generally about ⅔ the width of the cube. Return means, in the form of a dual notch or slot 114, is proVided in the track 112 to assure that the cubes are removed from the bowl 110 with their walls 16 extending upwardly. Cubes which begin moving upwardly along the track 112 with their wall sides down encounter the notches 114 whereby the weight of the cube in combination with the open spaces of the notch cause the cube to fall back into the bowl. Those cubes moving along the track with their flat bottom portions in direct contact with the track are able to slide across these notches without being returned to the bowl. Thus, each cube is properly oriented in position for further processing.

As the cubes exit the bowl at point A, the track bends so as to orient the cube in a "standing" position on one of its walls 16. Then, these cubes continue along the track and into an inner pin forming and inserting station 120, whereby inner pins are placed in the inner row of cube apertures. After the inner pin placement is completed, the cubes continue on to an outer pin forming and inserting station 130, for placement of the outer pins in the outer row of apertures in the cube. After all pins are placed, the PLCC connector illustrated in FIG. 13 is obtained.

Figure 2:
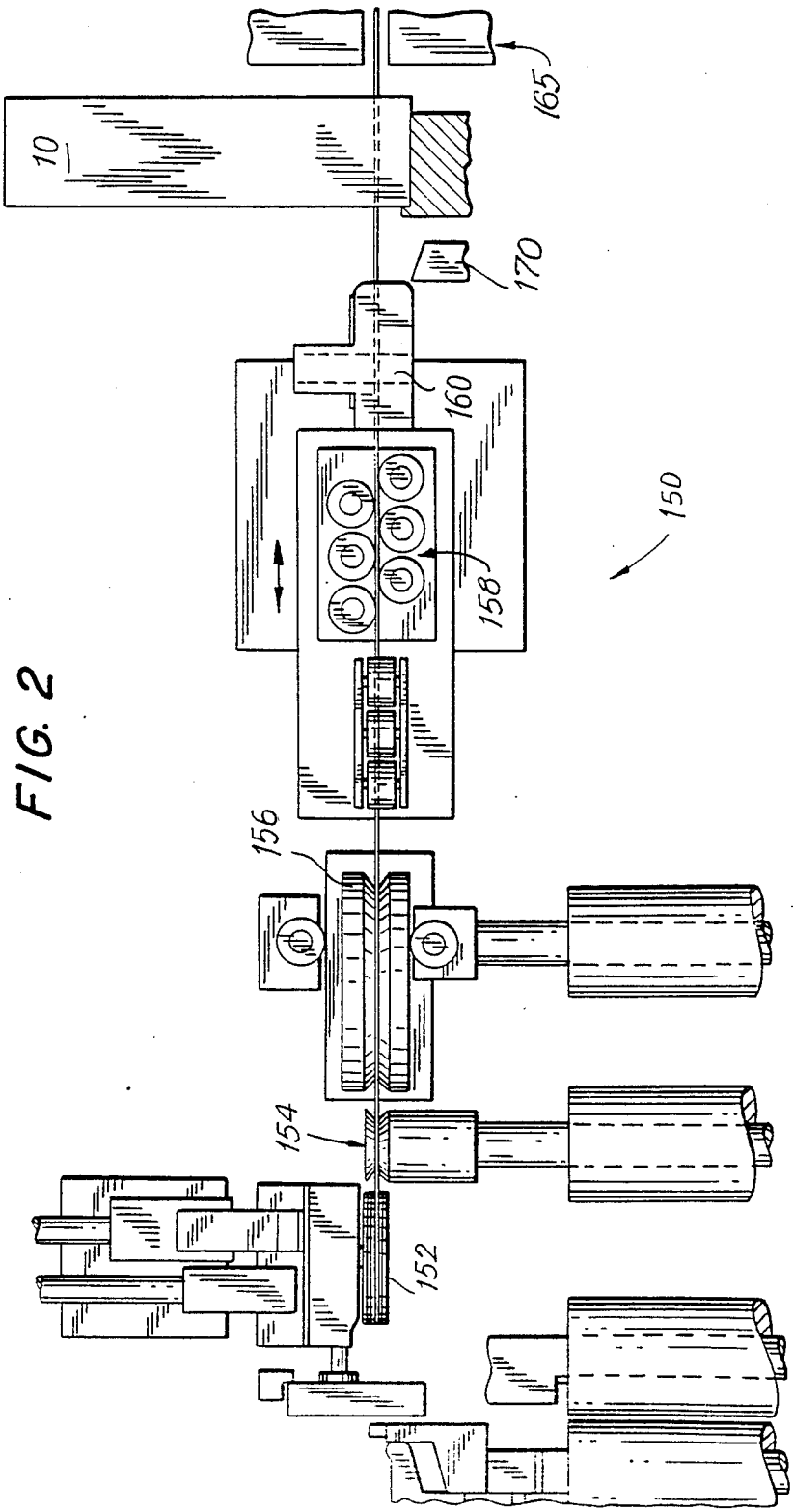
FIG. 2 is an enlarged top plan view of one of the wire feed devices of FIG. 1.

FIG. 2 is a detail of the wire feed advancing system 150 used in both the inner and outer pin forming and inserting stations 120, 130. A supply of wire, preferably from a spool 152, passes over an idler an idler pulley 154 and into a pair of blocks 156 which apply force to the end of the wire to straighten it before being formed and inserted into the base. The wire is moved forward by a second pair of blocks 158 which grasp the wire and then move it forward a desired length. As it moves forward, the wire passes through an aperture in an alignment block 160 which aligns and directs the wire through an aperture in the cube. The end 162 of the wire passes through the cube and into a pin forming mold 165. After the mold forms the desired pin configuration, the advancing blocks 158 retract the pin to insert it into the cube 10. Finally, a blade 170 cuts the wire to the desired length to complete the formation of the pin. An indexing mechanism then positions an adjacent aperture for reception of a pin in the same manner. The entire sequence for forming and inserting the pin into the cube is as follows:

(1) a cube aperture positioned in alignment with the wire end;

(2) blocks 158 contact the wire and advance the wire end through the cube aperture end into an open pin forming mold;

(3) the two halves of the pin forming mold close to form the configuration of the pin;

(4) the blocks 158 retract the formed pin into the cube where it snaps into the correct position;

(5) cutting blade 170 separates the formed pin from the wire supply;

(6) blocks 158 open and move toward the supply, while blocks 156 contact the wire to straighten it;

(7) blocks 156 open while blocks 158 contact the wire;

(8) an indexing mechanism adjusts the position of the cube so that the next adjacent aperture is aligned with the wire feed system; and (9) steps (1) to (8) are repeated as often as necessary to complete the placement of the array of pins in the cube.

FIGS. 3–5 illustrate the outer pin forming mold and the sequence of steps which occur in the forming of the outer pin 22. A perspective view of the final outer pin 22 is illustrated in FIG. 6.

FIG. 3 shows the forward end 162 of the wire extending from the alignment block past cutting blade 170, through cube 10 and into mold 175. The mold 175 is formed by discrete mold members 176, 177, 178 and 179 which form the various configurations and changes of direction on the forward end 162 of the wire by a forming operation when the mold members 176, 177, 178 and 179 are brought together, as shown in FIG. 4.

The remaining outer pin formation steps are illustrated in FIG. 5. After forming the pin, the mold members are moved apart, the pin is snapped into the cube aperture, and the cutting blade 170 trims the pin 22 to its proper length wherein the smaller bent portion of the pin enables it to be firmly locked in place in the cube.

Figure 7:
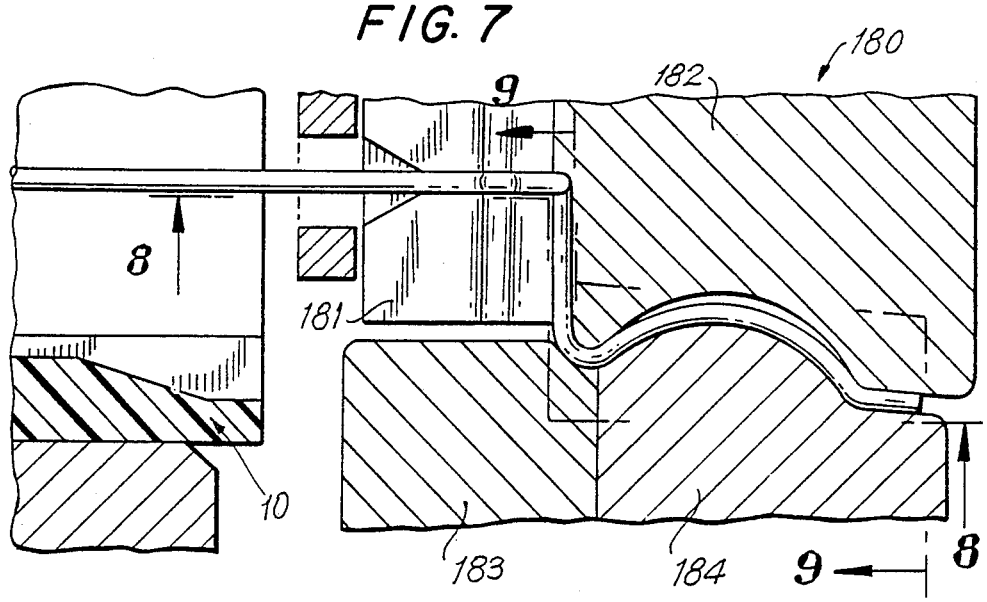
FIG. 7 is a side view partially in cross section similar to FIG. 4 illustrating the inner pin forming mold engaging a wire end.
Figure 8:
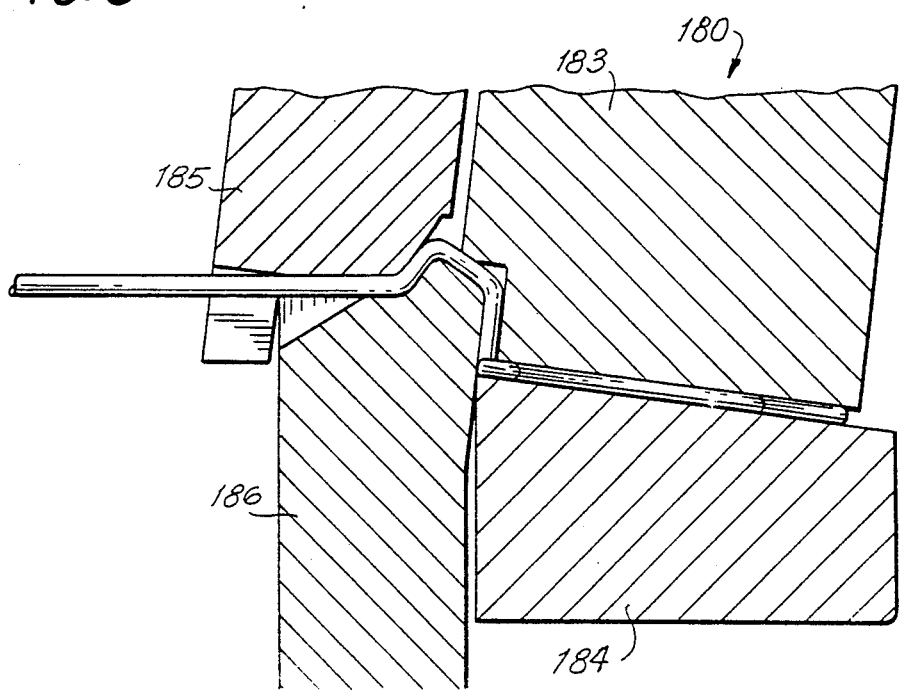
FIG. 8 is an enlarged side view of the inner pin forming mold of FIG. 7.
Figure 9:
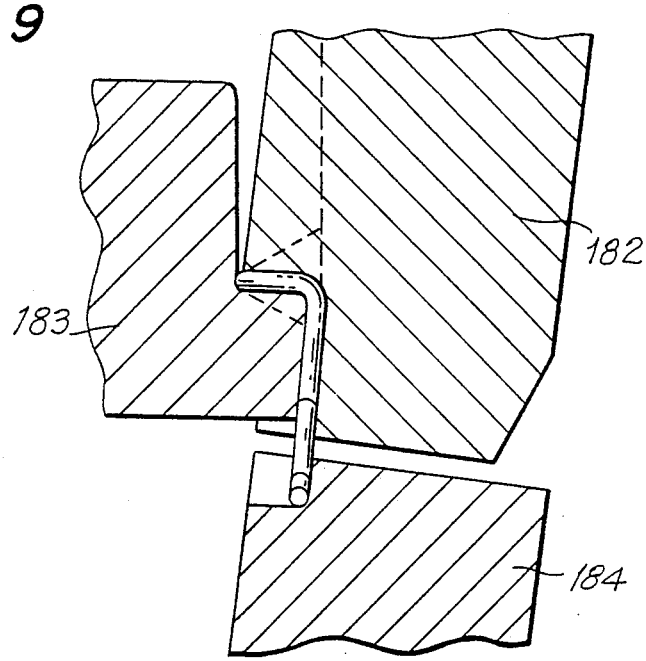
FIG. 9 is an enlarged end view of the inner pin forming mold of FIG. 7.
Figure 10:
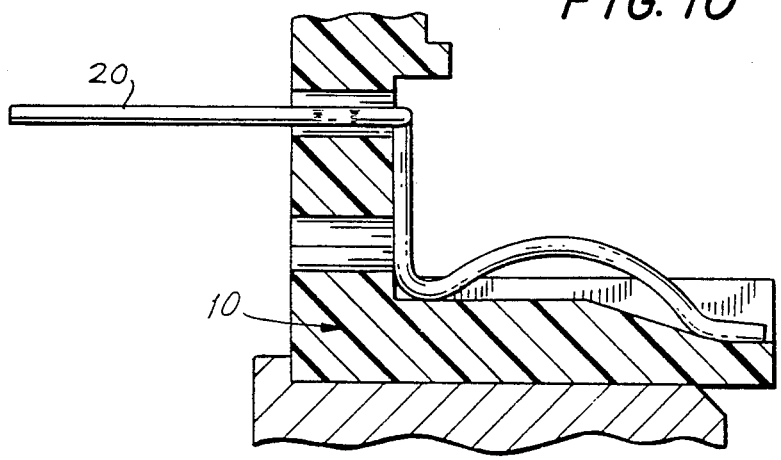
FIG. 10 is a side view of the formed inner pin retracted into position in the base.

The procedure for forming the inner pin 20 is substantially the same as for the formation of the outer pin, except that a different forming mold 180 is used. FIGS. 7–9 illustrate the mold members 181 through 186 which are contacting the wire end to form the inner pin. FIG. 10 shows the inner pin 20 in place in the cube 10, while FIG. 11 is a perspective view of the inner pin 20 itself.

The wire used to form these pins is preferably an 0.013 inch diameter phosphor bronze.

FIG. 12 is an exploded view of a portion of the cube to illustrate the respective positions of the inner 20 and outer 22 pins when locked into the apertures of the cube 10. FIG. 15 illustrates the prior art arrangement for supporting the pins in the aperture. As illustrated, the cube base includes a step 190 upon which a bent portion of the pin rests and is supported. As noted above, however, such pins need to be straightened and aligned after being placed in that manner, since there is no reproducible method for placing the pins in the correct position at the correct orientation. FIG. 16 illustrates the locking engagement of the pins into the apertures 18 according to the invention.

FIG. 13 illustrates the final assembly of the PLCC connector, with pins 20, 22 locked into and extending from apertures 18 in base 12. As can be best seen by a comparison with FIG. 14, the apertures 18 are 90° disposed from those of the prior art, with a point of each of the square apertures pointing perpendicularly to a side wall 16 of the cube. As shown in FIG. 14, the prior art utilizes cubes having square apertures whereby one side of the aperture is parallel with the adjacent side wall of the cube. By rotating these apertures 90°, the present invention obtains a construction whereby the pins 20, 22 are locked in the apertures 18. This also enables the pins 20, 22 to be properly oriented within the cube so that no further straightening or alignment is necessary.

The pins and cubes of the present invention provide a highly improved placement assembly, in that the pins are repeatedly and precisely oriented by locking engagement with the cube apertures: as noted above, straightening and reorientation are avoided.

FIGS. 17 and 18 depict a pick and place mechanism 200 designed to pick up a cube, rotate it 90° and place it at the top of the cube feeder track. The mechanism generally consists of a robotic manipulator using a cylindrical coordinate frame.

The base 201 of the manipulator is set firmly in place so that it cannot move with respect to the other machinery. Fixed to the base is an air cylinder 205, which is a long, hollow member housing a rod 210. The rod fits within the cylinder, moves axially outward from the cylinder, and rotates about its axis. The motion of the rod is controlled by pneumatic motors.

The arm 220 is attached at the forward tip 215 of the rod 210. The arm is a bar perpendicular to the axis of the rod, and extends radially outward from the rod axis. Attached to the forward end 225 of the arm 230 is a rectangular 230 bar extending forward from the arm, perpendicular to the length of the arm, and parallel to the rod. At the forward end 235 of this bar 230 are gripper fingers 240. These fingers extend forward from the bar 230, and open and close to grasp the cubes 10.

In the optimal situation, the feeder tract B is set above the output from the indexer (pick up location) A. The manipulator 200 is fixed so that when the rod is extended, forward tip 215 is located at the right angle of a right isosceles triangle with other vertices A and B and sides the length of the arm 220.

In operation, the manipulator is synchronized so that when a cube is outputted from the indexer, the manipulator is ready to pick it up. At this location A the rod 210 is extended, and rotated so that the arm 220 points 45 degrees downward from horizontal. The fingers 240 close around the cube, and the rod retracts. The rod 210 then rotates 90 degrees upward so that the arm 220 points 45 degrees above horizontal, and the cube has been rotated 90 degrees. The rod extends so the gripper fingers 240 reach the top of the feeder tract B, and then the fingers release the cube. Next, the rod retracts, rotates downward 90 degrees, and extends so it is ready to pick up another cube at the indexer output.

After all four sides of a cube have had wires inserted, the manipulator is programmed to not pick up the cube at the pick up site, but rather waits for a cube that is not completed.

Other types of pick and place mechanisms may also work suitably, but the optimal arrangement minimizes the number of pneumatic motors and programming steps that need to be employed to rotate and move the cubes through the system.

FIG. 19 depicts the indexing system of the invention. One indexing mechanism is driven by cam 253 and cam follower 255. A metal bar 257 attached to the cam follower contacts the lower branch of lever 259. The lever is "L" shaped, and hinged at the corner. The other branch of the lever contacts push rod 261. The push rod is adjustable by bolt 263. Pin 265 restricts the movement of washer 267. Spring 269 located between washer 267 and support 271, coils around push rod 262. Push rod 262 is attached to push rod 261 by bolt 263. Push rod 262 contacts pivot 275, which has a toe in contact with the teeth of rack 277. Spring 279, connected between the pivot 275 and mount 281, maintains the toe of the pivot 275 in proper position against the rack 277. This allows the pivot 275 to be retracted after one side of the cube has been provided with pins so that rack 277 can be returned to its starting position for operation on a subsequent cube.

A second indexing mechanism 280 in the form of an inclined arm 287 is utilized to operate the pivot 275 to allow the rack 277 to be moved downward. This mechanism 280 is driven by cam 283 and cam follower 285. An adjustable inclined metal arm 287 connects the cam follower 285 to an upper portion of mount 281. As the cam 283 rotates, the cam follower 285 causes arm 287 to move pivot 275, thus dropping the rack 277 a predetermined distance which corresponds to the spacing between the cube apertures.

In operation, the rack 277 engages a cube from the cube feeder tract. As the cam 283 rotates, the cam follower 285 contacts a displacement in the cam 283 and moves upward. Bar 287 pushes pivot 275, which causes the toe of the pivot to swing outward, allowing rack 277 to move down a notch. Release of the arm 287 causes the toe of pivot 275 to move back against the rack 277. The cube is thus in position for the next pin to be inserted, and the mechanism is reset. After all pins have been inserted in an entire side of a cube, the cube is released and the rack 277 is reset by another indexing mechanism beneath rack 277 (not shown) which returns the rack 277 to its original position for engaging another cube.

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

What is claimed is:

1. An apparatus for making a plastic leaded chip carrier connector comprising:
    means for aligning a base having a plurality of apertures with a wire feed device;
    means for advancing one end of a wire from said wire feed device from one side of said base and through a first aperture therein and such that said wire end extends from said base;
    means for forming a predetermined configuration of the wire at said end which has passed through the aperture of said base;
    means for retracting said formed wire end into said aperture so that said predetermined configuration lockingly engages said wire end with said aperture; and
    means for cutting said wire end so that said wire end forms a pin locked in said first aperture for conducting electrical information through said base.

2. The apparatus of claim 1 further comprising means for sequentially forming a pin in one or more additional apertures of said base.

3. The apparatus of claim 2 wherein said sequential pin forming means includes steps indexing means.

4. The apparatus of claim 1 further comprising means for ordering a plurality of said bases for sequential alignment with said wire feed device.

5. The apparatus of claim 4 wherein said ordering means comprises a track.

6. The apparatus of claim 4 wherein said ordering means includes vibrating bowl means for holding a plurality of said bases and means for advancing and sequentially moving said bases from said bowl means to said track.

7. The apparatus of claim 6 wherein said advancing means comprises a helical track extending from said bowl means to said base alignment means.

8. The apparatus of claim 5 wherein said advancing means includes means to return improperly ordered bases to said bowl means.

9. The apparatus of claim 1 wherein said forming means comprises moveable mold means.

10. The apparatus of claim 9 wherein said moveable mold means comprises at least two oppositely facing mold components which contact said wire end to form said predetermined configuration thereof.

11. The apparatus of claim 1 further comprising means to return said base to said base alignment means for sequentially forming additional pins in said apertures thereof.

12. The apparatus of claim 11 wherein said base return means rotates said base after one side thereof has been provided with said wire pins to enable said wire feed device to provide pins along a second side of said base.

13. The apparatus of claim 12 wherein said base return means rotates said base a predetermined number of times corresponding to the number of sides of said base so that each of said plurality of apertures on each side of said base is provided with a pin locked therein.

14. An apparatus for making a plastic leaded chip carrier connector comprising:
    means for aligning a base having a plurality of apertures with a wire feed device;
    means for advancing one end of a wire from said wire feed device from one side of said base and through a first aperture therein and such that said wire end extends from said base;
    means for forming a predetermined configuration of the wire at said end which has passed through the aperture of said base;
    means for retracting said formed wire end into said aperture so that said predetermined configuration lockingly engages said wire and with said aperture;
    means for cutting said wire end so that said wire end forms a pin locked in said first aperture for conducting electrical information through said base; and
    means for sequentially forming a pin in one or more additional apertures of said base, said sequential pin forming means comprising step indexing means.

15. The apparatus of claim 14 further comprising means for ordering a plurality of said bases for sequential alignment with said wire feed device.

16. The apparatus of claim 15 wherein said ordering means includes a track; vibrating bowl means for holding a plurality of said bases; and means for advancing and sequentially moving said bases from said bowl means to said track.

17. The apparatus of claim 16 wherein said advancing means includes a helical track extending from said bowl means to said base alignment means, said helical track including means to return improperly ordered bases to said bowl means.

18. The apparatus of claim 14 wherein said forming means comprises moveable mold means having at least two oppositely facing mold components which contact said wire end to form said predetermined configuration thereof.

19. The apparatus of claim 14 wherein said base has a plurality of sides and said apparatus further comprises means to return said base to said base alignment means for sequentially forming additional pins in said apertures thereof, wherein said base return means rotates said base after one side thereof has been provided with said wire pins to enable said wire feed device to provide pins along a second side of said base.

20. The apparatus of claim 19 wherein said base return means rotates said base a predetermined number of times corresponding to the number of sides of said base so that each of said plurality of apertures on each side of said base is provided with a pin locked therein.

21. An apparatus for making a plastic leaded chip carrier connector comprising:
   means for aligning a base having a plurality of apertures with a wire feed device;
   means for advancing one end of a wire from said wire feed device from one side of said base and through a first aperture therein and such that said wire end extends from said base;
   means for forming a predetermined configuration of the wire at said end which has passed through the aperture of said base;
   means for retracting said formed wire end into said aperture so that said predetermined configuration lockingly engages said wire end with said aperture;
   means for cutting said wire end so that said wire end forms a pin locked in said first aperture for conducting electrical information through said base; and
   means for ordering a plurality of said bases for sequential alignment with said wire feed device, said ordering means including a track; vibrating bowl means for holding a plurality of said bases; and means for advancing and sequentially moving said bases from said bowl means to said track; said advancing means comprises a helical track extending from said bowl means to said base alignment means, wherein said helical track includes means to return improperly ordered bases to said bowl means.

22. The apparatus of claim 21 further comprising means for sequentially forming a pin in one or more additional apertures of said base, wherein said sequential pin forming means includes step indexing means.

23. The apparatus of claim 21 wherein said forming means comprises moveable mold means having at least two oppositely facing mold components which contact said wire end to form said predetermined configuration thereof.

24. The apparatus of claim 21 wherein said base has a plurality of sides and said apparatus further comprises means to return said base to said alignment means for sequentially forming additional pins in said apertures thereof, wherein said base return means rotates said base a predetermined number of times corresponding to the number of sides of said base so that each of said plurality of apertures on each side of said base is provided with a pin locked therein.

* * * * *